United States Patent
Sugihara et al.

(10) Patent No.: US 8,631,299 B2
(45) Date of Patent: Jan. 14, 2014

(54) ERROR CORRECTION ENCODING METHOD AND DEVICE, AND COMMUNICATION SYSTEM USING THE SAME

(75) Inventors: Kenya Sugihara, Tokyo (JP); Hideo Yoshida, Tokyo (JP); Yoshikuni Miyata, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/502,420

(22) PCT Filed: Nov. 11, 2010

(86) PCT No.: PCT/JP2010/070118
§ 371 (c)(1),
(2), (4) Date: Apr. 17, 2012

(87) PCT Pub. No.: WO2011/062111
PCT Pub. Date: May 26, 2011

(65) Prior Publication Data
US 2012/0210189 A1    Aug. 16, 2012

(30) Foreign Application Priority Data
Nov. 17, 2009  (JP) ................. 2009-262332

(51) Int. Cl.
*H03M 13/00*  (2006.01)
*H04L 1/18*   (2006.01)

(52) U.S. Cl.
USPC .......................................... 714/751; 714/752

(58) Field of Classification Search
None
See application file for complete search history.

(56) References Cited

U.S. PATENT DOCUMENTS

| 6,895,547 | B2 | 5/2005 | Eleftheriou et al. |
| 8,341,487 | B2* | 12/2012 | Blanksby et al. ............ 714/752 |
| 8,433,971 | B2* | 4/2013 | Blanksby et al. ............ 714/752 |
| 2008/0294963 | A1 | 11/2008 | Hwang |
| 2008/0301518 | A1 | 12/2008 | Miyazaki |
| 2010/0153823 | A1 | 6/2010 | Noda |
| 2010/0281335 | A1* | 11/2010 | Blanksby et al. ............ 714/755 |

FOREIGN PATENT DOCUMENTS

| JP | 2009 21676 | 1/2009 |
| WO | 2007 091327 | 8/2007 |
| WO | 2008 143396 | 11/2008 |

OTHER PUBLICATIONS

JOO, H.G., et al., "New Construction of Rate-Compatible Block-Type Low-Density Parity-Check Codes Using Splitting," The 17th Annual IEEE International Symposium on Personal, Indoor and Mobile Radio Communications, Total 5 Pages, (Sep. 11, 2006).

(Continued)

*Primary Examiner* — Guerrier Merant
(74) *Attorney, Agent, or Firm* — Oblon, Spivak, McClelland, Maier & Neustadt, L.L.P.

(57) ABSTRACT

An error correction method and device and a communication system using them, including an LDPC code generation method capable of adjusting an encoding rate of an LDPC code in a variable manner while leaving the length of the code constant by use of an efficient encoding method or mechanism supporting a variable encoding rate, so that the encoding rate of the LDPC code can be adjusted without changing the code length. An error correction method includes a row dividing to divide each of a part or all of rows into two or more rows based on one parity check matrix, and a code construction to construct a plurality of LDPC codes with arbitrary code rates, respectively.

12 Claims, 11 Drawing Sheets

(56) References Cited

OTHER PUBLICATIONS

Jacobsen, N., et al., "Design of rate-compatible irregular LDPC codes based on edge growth and parity splitting," Proceedings of the 2007 IEEE 66$^{th}$ Vehicular Technology Conference, pp. 1052-1056, (Sep. 30, 2007).

International Search Report Issued Dec. 21, 2010 in PCT/JP10/70118 Filed Nov. 11, 2010.

Extended European Search Report issued May 24, 2013 in Patent Application No. 10831506.0.

Zhiyong He, et al., "LDPC Coded Wireless Networks with Adaptive Spectral Efficiency", Circuits and Systems for Communications, IEEE, XP31268651A, 2008, pp. 45-49.

Nicola Moschini, et al., STMicroelectronics LDPCC Proposal for 802.11n CFP, Working Group for Wireless Local Area Networks (WLANs), XP002696798, Aug. 13, 2004, 30 pages.

Jong-Ee Oh, et al., "Row-splitting design of Low-Density Parity-Check Codes for Gbps transmission", Vehicular Technology Conference, IEEE, 2007, pp. 1127-1131.

Office Action mailed Aug. 20, 2013, in Japanese Patent Application No. 2011-541901 (with English-language Translation), 8 pages.

Tadashi Wadayama., "Method for Practically Formatting LDPC Code (Part 3)", NIKKEI ELECTRONICS, No. 908, Nikkei Business Publications, Inc., Sep. 12, 2005, pp. 137-145 (5 pages).

* cited by examiner

ERROR CORRECTION ENCODING METHOD AND DEVICE, AND COMMUNICATION SYSTEM USING THE SAME

TECHNICAL FIELD

The present invention relates to an error correction encoding method and device which are provided with a step or means for constructing a plurality of LDPC (Low-Density Parity-Check) codes which are equal in code length but different in code rate from one another, and also to a communication system using such a method and device.

BACKGROUND ART

In general, in communication systems using an error correction encoding method and device, the larger the code rate, the higher becomes the efficiency of communication, but the lower becomes error correction capability. On the contrary, the lower the code rate, the lower becomes the efficiency of communication, but the higher becomes error correction capability. As a result, it becomes important to set the code rate in an appropriate manner according to the status of communication channels. Here, note that the code rate is a value "k/n" (=1−(the number of lines/the number of rows)) which is represented by the use of a code length n and an information sequence length k of an error correcting code.

In view of the above-mentioned technical background, in the past, in some communication systems, a plurality of error correcting codes of different encoding rates are installed or implemented on a communication system, so that a change-over setting of the coding rates can be made according to the status of the communication channels, etc.

In addition, low-density parity-check codes (Low-Density Parity-Check codes: hereinafter referred to as an "LDPC codes") are known as one scheme from the past.

The LDPC codes are codes which are defined by a parity check matrix in which elements of "1" are sparse (they exist at small proportion with respect to the number of all elements), and a row number n of the parity check matrix serves as a code length, and a column number m corresponds to a check bit (parity bit) number.

The number of "1s" which are contained in a column of the parity check matrix is referred to as a "column weight" in that column, and a distribution of the values of the column weights of individual columns is referred to as a "column weight distribution".

Although the column weight distribution influences the error correction capability of an LDPC code to a large extent, an optimal column weight distribution can be calculated from a density evolution method, etc.

In addition, similarly, the number of "1s" which are contained in a row of the parity check matrix is referred to as a "row weight" in that row.

Moreover, the parity check matrix can be expressed by a bipartite graph which is called a Tanner graph, but the larger the length of the shortest loop contained in the Tanner graph, the more the error floor of the LDPC code is reduced.

In the LDPC code, as the encoding rates thereof are different, the parity check matrices thereof also become different, and calculation operations carried out for encoding and decoding are dependent on the parity check matrices.

Accordingly, in cases where LDPC codes with a plurality of encoding rates are implemented on a single communication system, it becomes necessary to prepare a different encoder and decoder for each encoding rate.

For this reason, in the past, there have been developed Rate-Compatible LDPC codes (hereinafter referred to as "RC-LDPC codes") which serve to construct a communication system in an efficient manner by sharing circuits among a plurality of LDPC codes of different encoding rates.

In the design of RC-LDPC codes, a parity check matrix of an LDPC code with a high encoding rate is constructed in many cases, so that it matches a sub-matrix of a parity check matrix thereof with a low encoding rate, but it is difficult to provide optimal column weight distributions on both of the two kinds of encoding rates.

Accordingly, there has been proposed a technique in which a parity check matrix with a low encoding rate is first prepared, and the number of rows thereof is then increased by dividing a part of the rows into two rows, and at the same time, some columns are added, so that it is made possible to change over between two kinds of different encoding rates, for a parity check matrix before the row division and a parity check matrix after the row division (for example, see a first patent document).

In the conventional technique described in the above-mentioned first patent document, by devising the columns to be added, a structure of a staircase or step matrix (to be described later) is given to a parity check matrix, so that the construction of an encoding operation can be made to be adapted to or compatible with a change-over among the variable encoding rates in an efficient manner.

However, in this technique, each time one row is divided (i.e., each time parity bits are increased by one bit), one column with a column weight "2" is added, and hence, between the two kinds of encoding rates which are varied, both of their information sequence lengths k will be equal to each other, but their code lengths will be increased by the addition of the column.

Here, the change-over of the encoding rates has been described, but there is difficulty in the construction of the parity check matrices, as another problem of LDPC codes.

It is difficult to construct, at an arbitrary code length and an arbitrary encoding rate, a parity check matrix of which the shortest or minimum loop length in a Tanner graph is large.

Accordingly, in the past, after an LDPC code with values close to a desired code length and a desired encoding rate, respectively, has been constructed, the encoding rate has been adjusted by the use of a certain technique such as padding, puncture, etc.

Here, note that the padding is a technique in which the information sequence length k of information bits is made small by setting a part of the information bits to a certain fixed value at the time of transmission. Also, the puncture is a technique in which the length of parity bits is made small by not transmitting a part of the parity bits at the time of transmission.

However, in cases where the above-mentioned techniques have been applied, there has been a problem that a change in code length or a large deterioration in error correction capability may occur.

In addition, it is also possible to adjust the encoding rate by means of the method according to the above-mentioned first patent document, but in this case, too, the code length will be changed.

Next, reference will be made to encoding methods for LDPC codes.

There have been known some encoding methods for LDPC codes, and techniques using lower triangular matrices or staircase or step matrices have also been proposed (for example, see a first nonpatent document).

Here, an encoding using a lower triangular matrix as described in the above-mentioned first nonpatent document will be explained.

The lower triangular matrix is a matrix in which all the diagonal elements of an m×m sub-matrix which is at the rightmost side of an m×n matrix (here, m<n) are "1", and all the elements of the rows above the diagonal elements are "0".

In cases where the parity check matrix is a lower triangular matrix, a parity bit can be calculated based on the information bits only by carrying out exclusive OR operations.

For example, the first parity bit in a code word can be calculated by carrying out exclusive OR operations with respect to information bits corresponding to the columns which are "1" in the first row of the parity check matrix.

In addition, the j-th (>1) parity bit in the code word can be calculated by carrying out exclusive OR operations with respect to the entire information bits as well as the above-mentioned information bits and parity bits corresponding to those columns which are "1" in the j-th row of the parity check matrix, among the first through (j−1)-th parity bits. In other words, by calculating one by one in a sequential manner from the parity bit of the first bit, it is possible to calculate all the parity bits, thus making it possible to carry out an encoding.

In order to perform the above-mentioned encoding method, the parity check matrix needs to be a lower triangular matrix.

However, as described in the above-mentioned first nonpatent document, if row vectors when the rows of the parity check matrix have been transformed into vectors are linearly independent (i.e., if the rank and the number of rows of the parity check matrix match each other), the parity check matrix can be transformed into a lower triangular matrix by an elementary row operation and a column exchange (Gaussian elimination).

Here, note that the elementary row operation includes an operation which adds, to the elements of a certain row, the elements of another row in an elementwise manner (i.e., carries out exclusive OR), and a row exchange operation which exchanges two rows with each other. The column exchange is an operation which exchanges two columns with each other.

Even if the elementary row operation is carried out, a correspondence relation between the information bits of an LDPC code and a code word does not change. In other words, even if encoding is carried out based on the parity check matrix which has been transformed by the elementary row operation, the same result will be obtained as in the case where encoding is carried out based on the parity check matrix before subjected to the elementary row operation. On the other hand, when the column exchange is carried out, the correspondence relation between the information bits and the code word will collapse.

In many cases, the sparsity of "1" in the parity check matrix will be lost when an elementary row operation is carried out, so there is a technique which uses an original parity check matrix in which "1" is sparse, for decoding, and a lower triangular matrix (hereinafter referred to as an "encoding matrix") generated as mentioned above, for encoding.

As described above, in cases where the parity check matrix is subjected to lower triangulation to generate the encoding matrix by the use of the elementary row operation and the column exchange, the correspondence relation between the parity check matrix for decoding and the encoding matrix will be collapsed by the column exchange, but in order to solve this problem, the same column exchange as that carried out in the generation process of the encoding matrix should also just be carried out with respect to the parity check matrix for decoding.

PRIOR ART REFERENCES

Patent Documents

First Patent Document: WO2007-091327

Nonpatent Documents

First Nonpatent Document: "Low Density Parity Check Codes and Decoding Method Therefor", by Tadashi Wadayama, published by Triceps Corporation, issued on Jun. 5, 2002

SUMMARY OF THE INVENTION

Problems to be Solved by the Invention

The conventional error correction encoding method and device using an LDPC code generation means supporting variable code rate, as well as a communication system using them, serve to set an code rate in a variable manner by adding not only rows but also columns to a parity check matrix in order to construct an efficient encoding method, and hence, there has been a problem that in cases where the code rate is changed over from among a plurality of different values, the length of a code is also changed.

In addition, there has also been another problem that at the time of adjusting the encoding rate of an LDPC code by the use of the above-mentioned technique, too, the length of the code changes.

The present invention has been made in order to solve the problems as referred to above, and has for its object to obtain an error correction encoding method and device as well as a communication system using them, in which an LDPC code generation method capable of adjusting an code rate of an LDPC code in a variable manner while leaving the length of the code constant or unchanged, is achieved by the use of an efficient encoding method or means supporting a variable code rate, so that the code rate of the LDPC code can be adjusted without changing the length of the code.

Means for Solving the Problems

An error correction encoding method according to this invention which a plurality of LDPC codes having code lengths equal to one another and code rates different from one another are encoded is provided with an encoding step in which, when carrying out encoding of an LDPC code, among the plurality of LDPC codes, which corresponds to an code rate different from a first LDPC code corresponding to a first code rate, the encoding is carried out based on an encoding matrix for encoding an LDPC code which has a code length equal to that of the first LDPC code and an code rate different from that of the first LDPC code, the encoding matrix being generated based on a first encoding matrix or a sub-matrix of the first encoding matrix for carrying out the encoding of the first LDPC code.

Effect of the Invention

According to this invention, by an efficient encoding method supporting variable code rates, it is possible to achieve an LDPC code generation method in which the code rate of an LDPC code is made variable while leaving the length of the code constant or unchanged, thus making it possible to obtain an error correction encoding method which can adjust the code rate of the LDPC code without changing the length of the code.

MODES FOR CARRYING OUT THE INVENTION

First Embodiment

Hereinafter, reference will be made to an error correction encoding method (or device) according to a first embodiment of the present invention, while referring to the accompanying drawings.

Here, note that in this first embodiment of the present invention, it is assumed that an LDPC code to be handled is a systematic code and that a parity check matrix is an m×n matrix when the rightmost column m corresponds to a parity bit. However, this correspondence position of the parity bit is set for the sake of convenience, and including but not limited to this, it goes without saying that even if the correspondence position of the parity bit column is changed in an appropriate manner, the same or similar construction as in the present invention can be applied.

In addition, in the first embodiment of the present invention, it is assumed that an LDPC code is encoded by the use of an encoding matrix (check matrix for encoding) which is formed by transforming the parity check matrix into a lower triangular matrix, and the encoding rate (the number of rows) of the LDPC code can be varied by making the number of the rows of the parity check matrix variable by means of an operation called row division.

Figure 1:
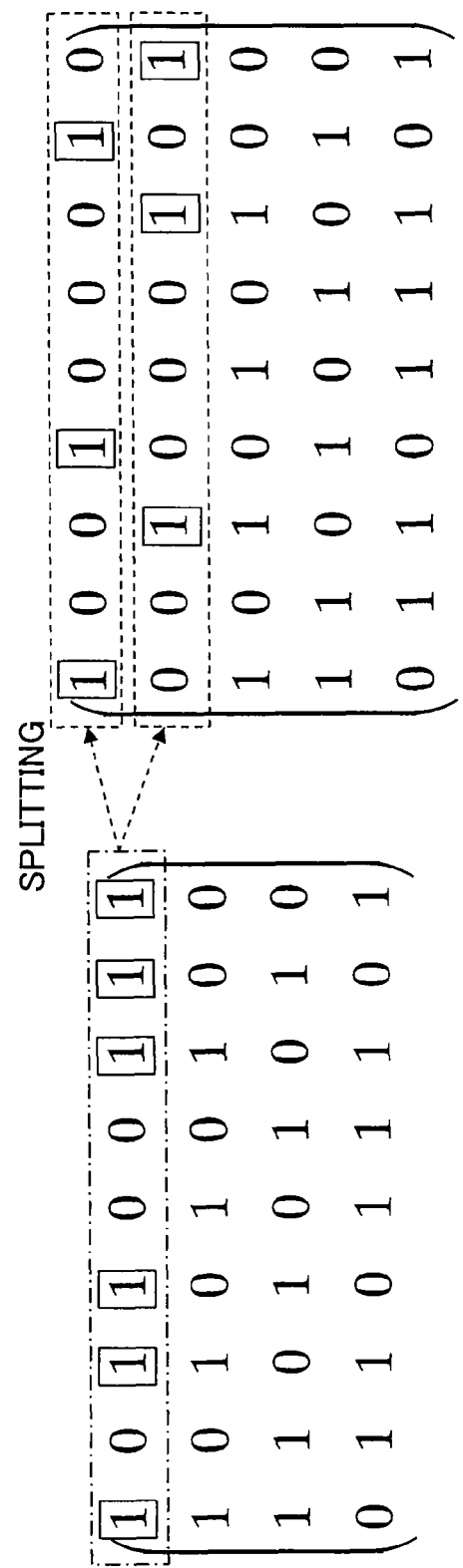
FIG. 1 is an explanatory view showing a row division of a parity check matrix according to a first embodiment of the present invention. (First Embodiment)

FIG. 1 is an explanatory view showing a row division of the parity check matrix according to the first embodiment of the present invention.

In FIG. 1, the "row division" is a technique of lowering the encoding rate by dividing and arranging "1s" contained in one row (see a frame drawn by an alternate long and short dash line) of the parity check matrix into two or more new rows (see frames drawn by broken lines) each containing "1s", thereby to increase the original number of rows.

As shown in FIG. 1, the encoding rate of the parity check matrix is made variable by using a parity check matrix before the row division and a parity check matrix after the row division while changing over therebetween.

At this time, it is featured as follows: (1) the code length (=9) is the same before and after the row division; (2) the column weight (the number of "1s") of each column (the original column and the divided columns) is the same before and after the row division; and (3) the inner periphery or circumference (girth) of a Tanner graph of the parity check matrix does not decrease before and after the row division. In particular, the above latter two features (2) and (3) indicate that the error correction capability is still high even after the row division.

However, even if the original parity check matrix has a structure (a lower triangular matrix or a step matrix) in which efficient encoding can be made, the structure will collapse due to the row division, and hence, it is not possible to construct an encoding method which is adapted to or compatible with the variable encoding rate in a simple manner.

Accordingly, for example, in the aforementioned first patent document, a column has been newly added after the row division of FIG. 1 in order to cope with this problem, but the length of a resultant code has become different according to individual encoding rates due to the addition of the column.

On the other hand, the first embodiment of the present invention achieves an encoding method which is capable of carrying out encoding in an efficient manner, without adding a new column, even after the row division of FIG. 1.

Figure 2:
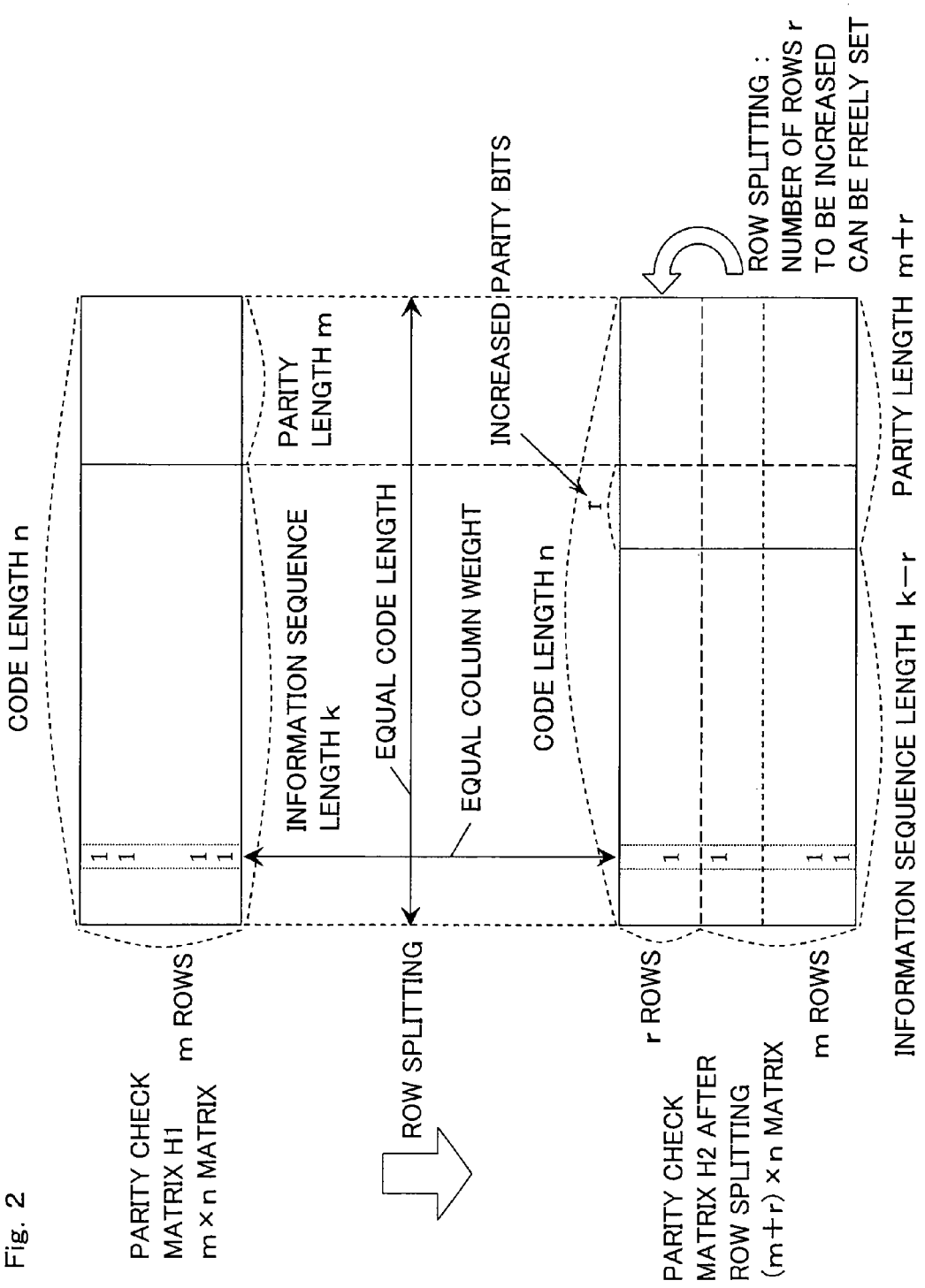
FIG. 2 is an explanatory view showing the parity check matrices before and after the row division according to the first embodiment of the present invention. (First Embodiment)

FIG. 2 is an explanatory view showing the parity check matrices before and after the row division in the first embodiment of the present invention.

In FIG. 2, an original parity check matrix H1 (see an upper side) is an "m×n" matrix which consists of the number of rows m, and the length of code n, and a divided parity check matrix H2 (see a lower side), which has been increased by r rows by the row division, is an "(m+r)×n" matrix which consists of the number of rows "m+r" and the length of code n. Here, the number of increased rows r corresponds to the number of increased parity bits.

As shown in FIG. 2, before and after the row division, the code length n is the same, and the column weight in each column is also the same.

Here, note that in the first embodiment of the present invention, there is no limitation in particular as to how many rows one row is to be divided into, so it is possible to set the number of rows r desired to be increased (the number of parity bits desired to be increased) not only by the number of those rows which are to be divided, but also by the number of rows into which one row is divided.

In addition, the error correction encoding method according to the first embodiment of the present invention can be applied to a communication system, but in that case, the communication system will be provided with an encoding matrix for encoding (to be describes later), aside from a parity check matrix used for decoding.

Moreover, if the encoding matrix is generated by the following method, it will become possible to carry out the encoding of an LDPC code at a plurality of encoding rates by the use of one encoding matrix.

Further, according to the encoding method using the following encoding matrix, it is possible to solve both of a first problem in which the structure of a matrix is collapsed due to the row division thereof, and a second problem in which the length of a code becomes different for each of variable encoding rates Next, reference will be made to a generation method for an encoding matrix in the error correction encoding method (or device) according to the first embodiment of the present invention, while referring to FIG. 3 and FIG. 4 together with FIG. 1 and FIG. 2.

Figure 3:
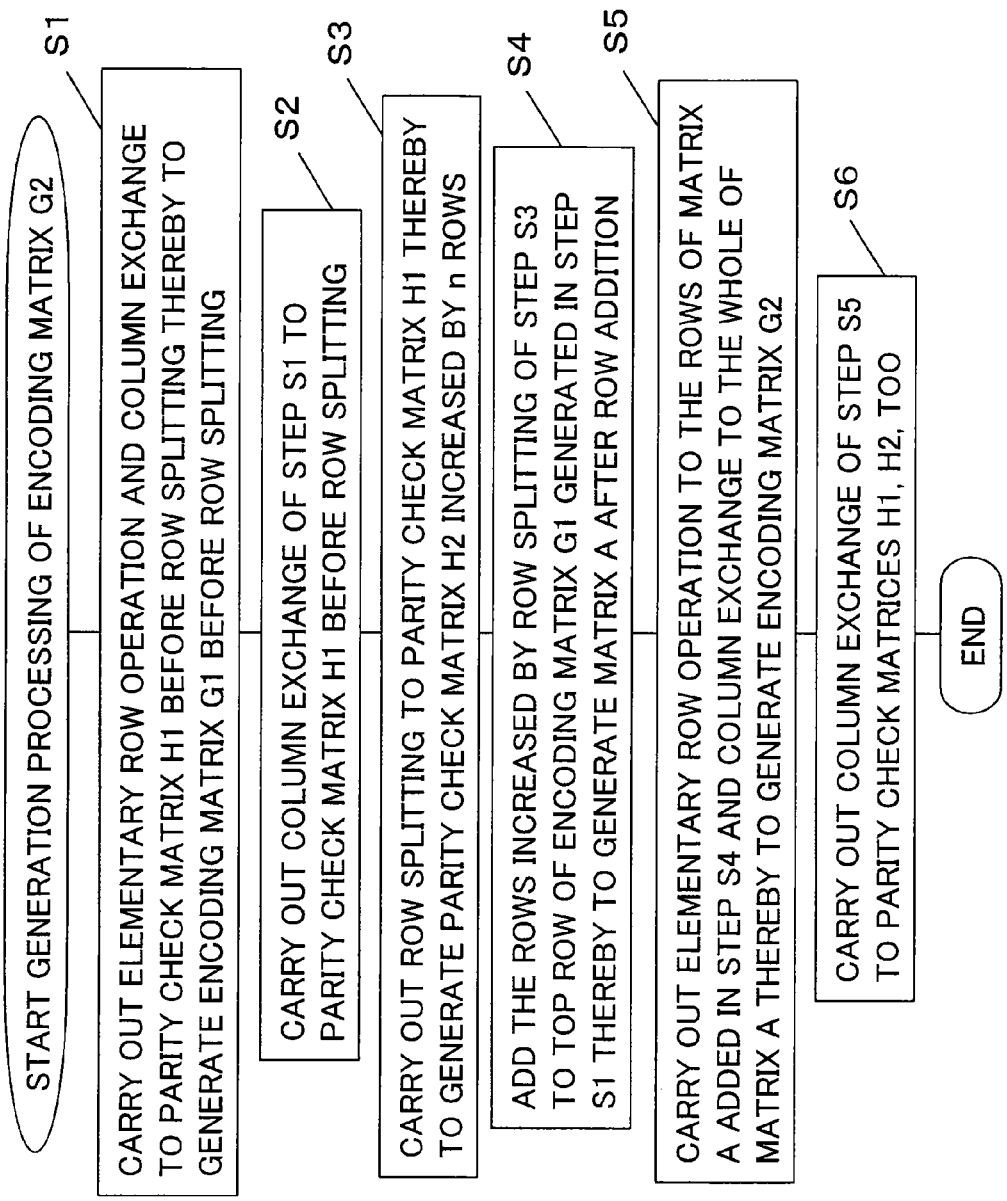
FIG. 3 is a flow chart showing a generation method for an encoding matrix according to the first embodiment of the present invention. (First Embodiment)
Figure 4:
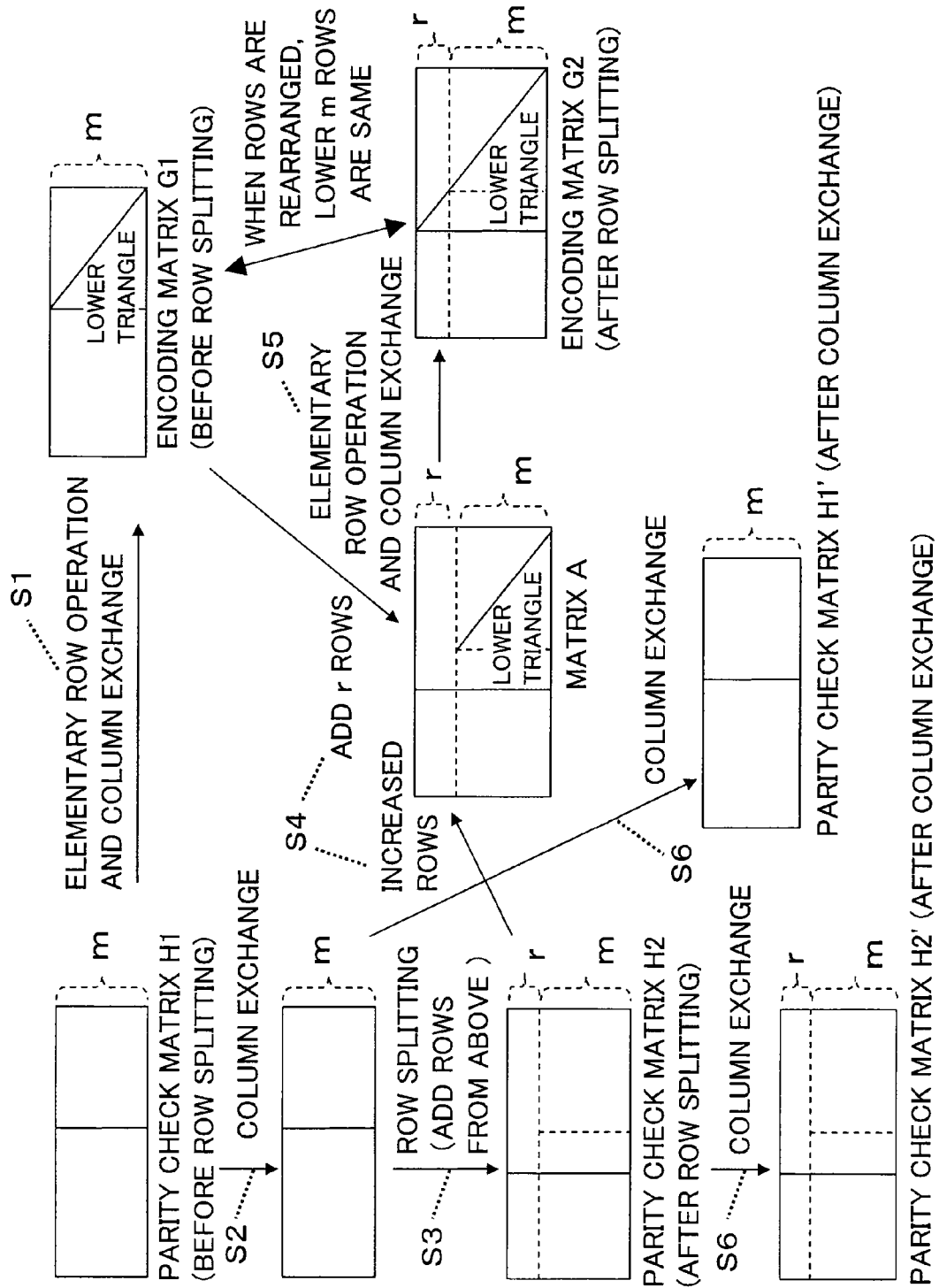
FIG. 4 is an explanatory view showing those matrices which are treated or handled in individual steps in FIG. 3. (First Embodiment)

FIG. 3 is a flow chart showing a generation method for an encoding matrix G2 according to the first embodiment of the present invention, and FIG. 4 is an explanatory view showing matrices to be handled in individual steps S1 through S6 in FIG. 3, respectively. Here, note that the error correction device according to the first embodiment of the present invention can be achieved by replacing each of the steps S1 through S6 with individual means, respectively.

In FIG. 3 and FIG. 4, first, the parity check matrix H1 before row division is lower triangulated by carrying out an elementary row operation and a column exchange thereon, so that an encoding matrix G1 is thereby generated, as shown in FIG. 4 (step S1).

Subsequently, the column exchange of step S1 is carried out on the parity check matrix H1 before the row division (before lower triangular operation), so that the sequence of the columns of the parity check matrix H1 is made to match the sequence of the columns of the encoding matrix G1 (step S2).

Then, the rows of the parity check matrix H1 are divided to generate a parity check matrix H2 in which the number of rows of the parity check matrix H1 is increased by r rows (step S3).

However, the row division of step S3 is carried out in such a manner that the individual row vectors of the parity check matrix H2 after the row division become linearly independent from one another. As long as this condition is satisfied, there is no limitation as to how many rows the rows of the parity check matrix H1 before division are divided into, and one row may be divided into any number of rows.

As an example of the row division, there is a method of dividing rows with large row weights of the parity check matrix H1 before division, thereby making smaller a deviation in the row weights of the parity check matrix H2 after the row division. According to this method, in many cases, the row vectors of the parity check matrix H2 become linearly independent from one another.

In addition, as another example of the row division, there is also a method of dividing the rows in such a manner that the row weight of each row after the row division becomes the number of a "power of 2" as much as possible. According to this method, it becomes possible to attain a reduction in the amount of memory of an error correction circuit as well as a reduction in circuit structure or size thereof.

The row division in the first embodiment of the present invention also has no limitation as to how "1s" in the original rows are distributed to the plurality of rows after the row division, and any distribution may be made as long as the row vectors of the parity check matrix H2 after the row division become linearly independent from one another.

As examples of such, there are a method of making a random distribution, and a method of distribution in which "1s" belonging to rows to be divided are arranged in rows after row division one by one in a sequential manner from the smallest row number to the largest row number.

Then, following the row division (step S3), a matrix A is generated by adding the r rows increased according to the row division of step S3 to the uppermost or top row of the encoding matrix G1 generated in step S1, as shown in FIG. 4 (step S4).

However, the rows to be added in step S4 are selected as follows.

For example, in cases where a row division is applied to the parity check matrix H1 by dividing only one row thereof into q rows, "q−1" rows except for one arbitrary row in the q rows are added to the encoding matrix G1.

In addition, in cases where two or more rows among the rows of the parity check matrix H1 are divided, too, all the rows except for one arbitrary row in the rows generated in each row division are similarly added to the encoding matrix G1, respectively.

Subsequently, the matrix A generated in step S4 is transformed into a lower triangular matrix, so that the encoding matrix G2 corresponding to the parity check matrix H2 after the row division is generated (step S5).

At this time, as shown in FIG. 4, the lower m rows of the matrix A is the encoding matrix G1 and has already been transformed into the lower triangular matrix, so an elementary row operation is carried out only on the upper r rows added in step S4, and if necessary, a column exchange will be carried out with respect to the entire matrix A.

In the operation carried out on the matrix A in the above-mentioned step S5, the following restrictions are added.

First of all, at the time of carrying out an elementary row operation, a row exchange should not be carried out between the rows added in step S4 and the lower m rows. In other words, the row exchange is carried out only between the rows of the r rows added in step S4. However, an operation of adding a row(s) belonging to the lower m rows (i.e., carrying out exclusive OR operations in an elementwise manner) should be carried out with respect to the rows added in step S4.

In addition, a column exchange should not be carried out with respect to the rightmost m columns of the matrix A (columns in which the lower m rows are already transformed into a lower triangular matrix).

Even if the above limitation is applied, in cases where the individual row vectors of the parity check matrix H2 are linearly independent from one another, it is possible to transform the matrix A into a lower triangular matrix.

Finally, the column exchange of step S5 is also carried out with respect to the parity check matrices H1, H2, so that parity check matrices H1', H2' of which the columns are made to correspond to those of the encoding matrices G1, G2, respectively, are generated (step S6), and thereafter, the generation processing routine for the encoding matrix G2 shown in FIG. 3 and FIG. 4 is ended.

The lower m rows of the encoding matrix G2 generated by the above method form a matrix in which the columns of the encoding matrix G1 corresponding to the parity check matrix H1 before the row division are rearranged.

In addition, the individual rows of the encoding matrix G2 are a matrix which is obtained by carrying out the elementary row operation and the column exchange with respect to the parity check matrix H2 after the row division, and hence the encoding matrix G2 is an encoding matrix which corresponds to the parity check matrix H2 after the column exchange.

In other words, in the communication system using the error correction encoding method according to the first embodiment of the present invention, if the LDPC code before the row splitting is used, encoding should just be carried out by the use of the lower m rows of the encoding matrix G2, and decoding should just be carried out by the use of the parity check matrix H1' after the column exchange according to step S6.

On the other hand, in cases where the LDPC code after the row division is used, encoding can be carried out by the use of all the rows of the encoding matrix G2, and decoding can be carried out by the use of the parity check matrix H2' after the column exchange.

Here, note that in a decoding operation part (or decoder), it is not necessary to necessarily store both of the parity check matrices H1, H2, but if there are one of the parity check matrices and information about the row division, it is possible to generate the other parity check matrix.

In this case, the column exchange of step S6 in FIG. 3 and FIG. 4 should just be carried out only with respect to either one of the parity check matrices H1, H2 (the one which is stored in the decoding operation part).

As described above, the error correction encoding method according to the first embodiment (FIG. 1 through FIG. 4) of the present invention is provided with a row splitting step to split each of a part or all of rows into two or more rows based on one parity check matrix H1, and a code construction step to construct a plurality of LDPC codes with arbitrary code rates (numbers of rows), respectively.

The row dividing step carries out the row division in such a manner that the numbers of non-zero elements contained in the individual rows of the parity check matrix H2 after the row division, respectively, do not deviate depending on the rows.

Moreover, the row dividing step carries out the row division in such a manner that as many rows as possible in the parity check matrix H2 after the row division contain a power of 2 of non-zero elements.

In addition, when the individual rows of the parity check matrix H2 after the row division are seen as vectors, respectively, the row dividing step carries out the row division in such a manner that the vectors become a linearly independent relation with respect to one another.

Further, the error correction encoding method according to the first embodiment of the present invention is provided with an encoding step (FIG. 3, FIG. 4) to encode a plurality of LDPC codes of which the code lengths n are equal to one another and the code rates "k/n" are different from one another.

The encoding step prepares only the encoding matrix G1 corresponding to a maximum LDPC code which has the largest encoding rate (the largest number of rows) among the plurality of LDPC codes, and at the time of encoding the LDPC codes other than the maximum LDPC code, the encodes are carried out based on a sub-matrix of the encoding matrix G1 corresponding to the maximum LDPC code.

The encoding matrix G1 corresponding to the maximum LDPC code has a lower triangular structure.

Specifically, the encoding step includes an encoding matrix generation step which generates the encoding matrix G1 corresponding to the maximum LDPC code.

The encoding matrix generation step is provided with a first lower triangulation step (step S1) to transform into a lower triangular matrix a parity check matrix of a minimum LDPC code with the smallest encoding rate among the plurality of LDPC codes, and a first column exchange step (step S2) to apply a column exchange carried out in the first lower triangulation step (step S1) to the parity check matrix H1 for the plurality of LDPC codes.

In addition, the encoding matrix generation step is provided with a row addition step (steps S3, S4) to add a part of rows of a parity check matrix of a second minimum LDPC code with the second smallest encoding rate next to the minimum LDPC code of which the first lower triangulation has already been carried out among the plurality of LDPC codes to the uppermost or top row of the matrix of which the first lower triangulation has already been carried out.

Further, the encoding matrix generation step is provided with a second lower triangulation step (step S5) to transform the entire matrix into a lower triangular matrix without collapsing the lower triangular structure which those rows other than the added rows have, with respect to the matrix A to which rows have been added according to the row addition step (steps S3, S4), and a second column exchange step (step S6) to apply a column exchange carried out in the second lower triangulation step (step S5) to the parity check matrix H1 for the plurality of LDPC codes.

In addition, the code construction step according to the first embodiment of the present invention extracts a sub-matrix of one parity check matrix H1 thereby to generate a new parity check matrix, so that it constructs an LDPC code of which the encoding rate is smaller than that of an LDPC code of the one parity check matrix.

Moreover, the code construction step adds new rows to one parity check matrix H1 thereby to generate a new parity check matrix, so that it constructs an LDPC code of which the encoding rate is larger than that of an LDPC code of the one parity check matrix.

In this manner, according to the efficient encoding method of this embodiment supporting the variable code rates, it is possible to achieve an LDPC code generation method in which the code rate of an LDPC code is made variable while leaving the length n of the code constant or unchanged, thus making it possible to obtain an error correction encoding method which can adjust the code rate of the LDPC code without changing the length n of the code.

In addition, in cases where the first embodiment of the present invention is applied to a communication system, in the communication system which supports LDPC codes with two kinds of encoding rates, the lengths of the codes in the two kinds of encoding rates can be set constant.

Further, the encoding matrix can be shared between the two kinds of encoding rates, and a part of an encoding operation can be made common therebetween, and hence, an amount of arithmetic operations and a storage area of the encoding operation part (or encoder) can be reduced, and a circuit scale or size thereof can be made small.

Furthermore, if the column weight distributions are equal at the two kinds of encoding rates, and if the column weight distribution of the parity check matrix H1 before the row division is an optimum value, high error correction capability will be attained at both of the two kinds of encoding rates.

Here, note that the row division, which can be applied in the first embodiment of the present invention, has no limitation that should divide one row into two rows, and hence, for example, one row may be divided into three rows, or all the rows of the original parity check matrix H1 may be divided, or only a part of the rows of the original parity check matrix H1 may be divided.

As a result of this, the degree of freedom is high, and the number of rows to be increased can be set by the row division, so that a broad range of encoding rate can be made variable.

In addition, the first embodiment of the present invention can be applied, not only in the case of intending to make the encoding rate variable, but also in the case of intending to construct an LDPC code of an arbitrary encoding rate, by adjusting the length of information bits and the length of parity bits, while leaving the code length n of the LDPC code constant or fixed.

For example, there may be a case where one would like to construct an LDPC code so as to conform to a frame format of the communication system, but it will be difficult to generate the number of columns and the number of rows of the parity check matrix H1 as required by the frame format.

In order to achieve this, the parity check matrix H1 is first generated in such a manner that the number of columns of the parity check matrix H1 (the code length n of the LDPC code) matches the frame format, and then, the number of rows of the parity check matrix H1 is increased by means of row division.

As a result of this, it is possible to adjust the length of information sequence k and the length of parity bits in units of one bit, so that they can be made to match the frame format, without changing the code length n.

Moreover, such an adjustment method is effective in cases where only the code length n of the LDPC code has been decided or fixed, but the encoding rate "k/n" or the information sequence length k has not yet been decided or fixed.

For example, at the time of constructing a concatenated code by the use of the LDPC code, the length of parity bits which is used in the entire concatenated code has been decided according to the requirements of the frame format, but in cases where the encoding rates of the individual error correcting codes, which construct the concatenated code, have not yet been decided or fixed, the encoding rate of the LDPC code can be adjusted n units of one bit according to the above-mentioned technique.

However, in the LDPC code, the ease of the occurrence of a residual bit error after decoding thereof is different for each bit which forms a code word.

In other words, the ease of the occurrence of a bit error is different depending on whether to which column of the parity check matrix H1 the bit (error bit) corresponds or belongs, and hence, if the row dividing step is carried out in the manner as mentioned above, the parity check matrix will change, so that the column (bit position in the code word) in which a residual bit error tends to occur may change.

Accordingly, in the communication system to which the error correction encoding method according to the first embodiment of the present invention is applied, in cases where a concatenated code in which an inner code is formed of an LDPC code is adopted in an error correcting system, the position of the occurrence of an error bit changes with a change-over of the LDPC code which is the inner code, thus giving rise to a possibility that an outer code may be affected.

However, if the columns corresponding to an information sequence are rearranged with respect to the encoding matrix G2 and the parity check matrix H2 which have been generated according to the first embodiment of the present invention, it will be possible to suppress the influence caused by the above-mentioned problem.

For example, if such a rearrangement is carried out in random order, the influence due to the above-mentioned problem will become small. However, at this time, it is necessary to carry out the same rearrangement with respect to the parity check matrix H2 and the encoding matrix G2.

In the error correction encoding device according to the first embodiment of the present invention, too, it is possible to achieve the operational effects as mentioned above by the provision of means to carry out the above-mentioned respective steps.

Second Embodiment

Here, note that in the above-mentioned first embodiment (FIG. 1 through FIG. 4), the parity check matrix H2 is generated by the row division of the parity check matrix H1, but row combination (coupling) may be used in place of the row division.

In this case, a row combining step to combine two or more rows with one another based on one parity check matrix is used in place of the above-mentioned row dividing step.

The row combination is an operation opposite to the row division, and is an operation of reducing the number of rows by combining two or more rows into one row by means of elementwise addition (combination).

That is, even in cases where row combination is applied to the parity check matrix H2 to generate the parity check matrix H1 which is decreased in the number of rows from the parity check matrix H2, it is possible to generate the encoding matrix G2 according to the above-mentioned generation method (FIG. 3) for the encoding matrix G2.

In this case, first, the parity check matrix H1 is generated in advance by applying row combining (or coupling) operations to the parity check matrix H2. However, before carrying out the row combination of the parity check matrix H2, it is necessary to arrange all but one of the rows to be combined by each row combining operation on the top row of the parity check matrix H2, respectively.

After that, step S1 in FIG. 3 is carried out, and in the following step S2, column exchange or switching is carried out not only on the parity check matrix H1 but also on the parity check matrix H2.

In addition, in step S3, assuming that the row division completely inverse to the row combination at the time of generating the parity check matrix H1 is to be carried out, there is generated the parity check matrix H2 with the arrangement of the rows thereof being made as referred to above.

Subsequent steps S4 through S6 should just be carried out in the manner as mentioned above (FIG. 3).

According to the above construction, in the communication system which supports LDPC codes with two kinds of encoding rates, the lengths of the codes in the two kinds of encoding rates can be set constant. In addition, the encoding matrix can be shared between the two kinds of encoding rates, and a part of an encoding operation can be made common therebetween, and hence, an amount of encoding operations, or an amount of arithmetic operations, a storage area and a circuit scale or size of the encoder can be made small.

In addition, as mentioned above, in the LDPC codes, the ease of the occurrence of a residual bit error after decoding is different for each bit which forms the code word, and the easiness of occurrence of a bit error is different depending on whether to which column of the parity check matrix H1 the bit (error bit) corresponds or belongs. As a result, if the row combining step is carried out in the manner as mentioned above, the parity check matrix will change, and so, there is a possibility that the column (bit position in the code word) in which a residual bit error tends to occur may change.

Accordingly, in the communication system to which the error correction encoding method according to the second embodiment of the present invention is applied, in cases where a concatenated code in which an inner code is formed of an LDPC code is adopted in an error correcting system, the position of occurrence of an error bit changes with a changeover of the LDPC code which is the inner code, thus giving rise to a possibility that an outer code may be affected.

However, similarly as mentioned above, if the columns corresponding to an information sequence are rearranged with respect to the encoding matrix G2 and the parity check matrix H2 which have been generated according to the second embodiment of the present invention, it will be possible to suppress the influence caused by the above-mentioned problem.

For example, if such a rearrangment is carried out in random order, the influence due to the above-mentioned problem will become small. However, at this time, it is necessary to carry out the same rearrangement with respect to the parity check matrix H2 and the encoding matrix G2.

Third Embodiment

Here, note that in the above-mentioned first embodiment (FIG. 1 through FIG. 4), the encoding matrix G2 is generated which supports the two kinds of encoding rates of the parity check matrix H1 and the parity check matrix H2 which is formed by carrying out the row division of the parity check matrix H1. However, an encoding matrix G3 (see FIG. 6) may be generated with respect to a parity check matrix H3 (see FIG. 5) which is generated by further carrying out the row division of the parity check matrix H2, and moreover, encoding matrices Gc and parity check matrices Hc corresponding to c ($\geq 3$) kinds of encoding rates ((c−1) row divisions) may be generated by repeating the similar operations, as shown in FIG. 7.

Figure 5:
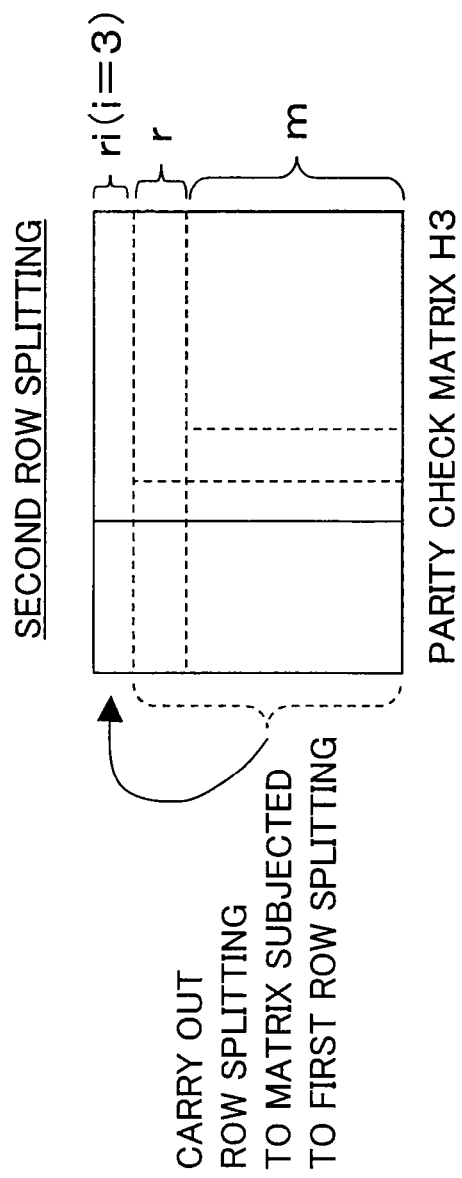
FIG. 5 is an explanatory view showing a parity check matrix which has been generated by a further row division according to a third embodiment of the present invention. (Third Embodiment)
Figure 6:
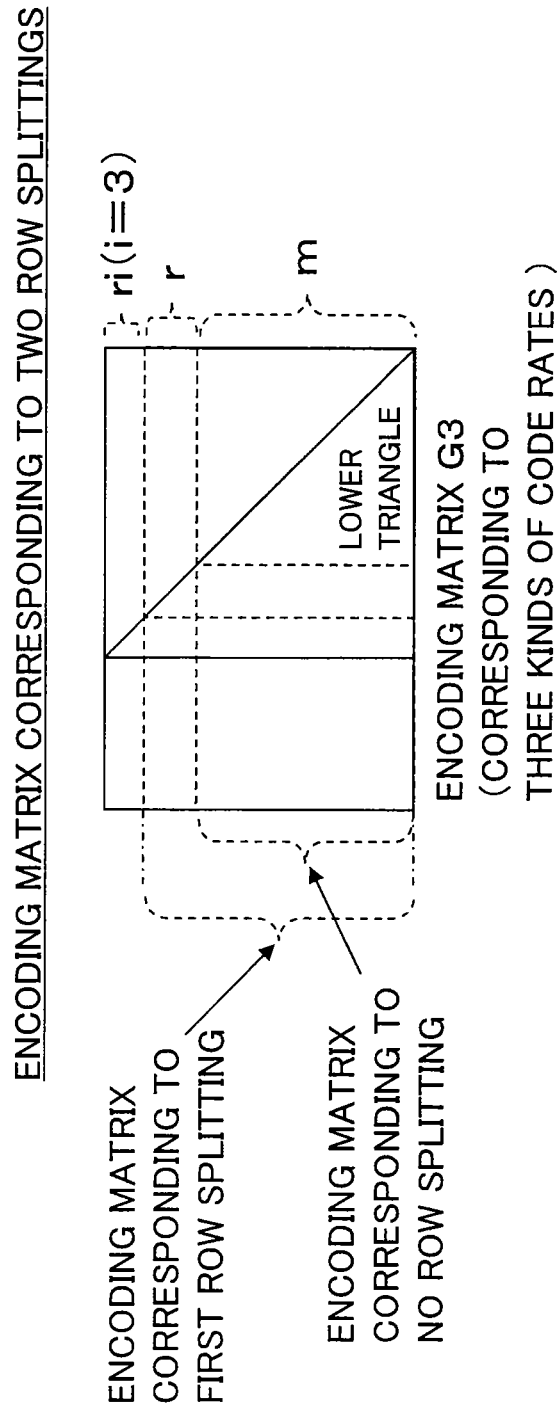
FIG. 6 is an explanatory view showing an encoding matrix which has been generated according to the third embodiment of the present invention. (Third Embodiment)

FIG. 5 is an explanatory view showing the parity check matrix H3 which has been generated by a further row division (twice) according to a third embodiment of the present invention, and FIG. 6 is an explanatory view showing the encoding matrix G3 which has been generated according to the third embodiment of the present invention.

Figure 7:
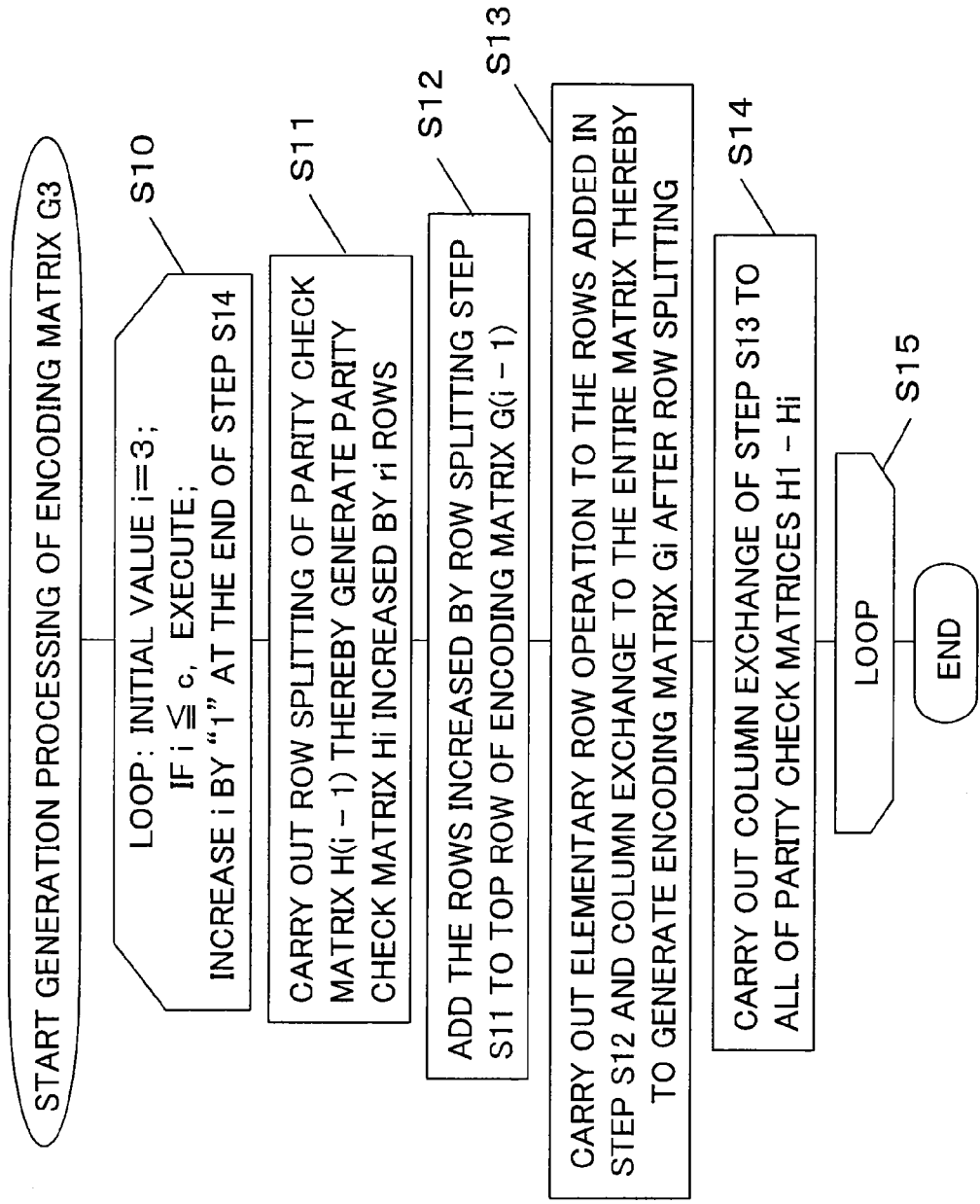
FIG. 7 is a flow chart showing a generation method for the encoding matrix according to the third embodiment of the present invention. (Third Embodiment)

In addition, FIG. 7 is a flow chart showing a generation method for the encoding matrix G3 according to the third embodiment of the present invention.

Hereinafter, reference will be made to the generation method for the encoding matrix G3 in an error correction encoding method according to the third embodiment of the present invention, while referring to FIG. 5 through FIG. 7.

However, here it is assumed that the encoding matrix G2 has already been obtained according to the above-mentioned generation method for the encoding matrix G2 (FIG. 3), and, in addition, that the parity check matrices H1, H2 have been obtained in which column exchange corresponding to the encoding matrix G2 has been carried out.

In FIG. 5, the number of rows of the parity check matrix H3 is increased by an initial value (i=3) of ri by further applying a second row division to the matrix H2 which has already been once subjected to a first row division.

Similarly, in FIG. 6, the number of rows of the encoding matrix G3 (corresponding to three kinds of encoding rates) is further increased by ri (i=3) with respect to the encoding matrix G2 which corresponds to the first row division.

The flow chart of FIG. 7 is basically the same as the above-mentioned one (FIG. 3), and what is greatly different from that of FIG. 3 resides in only two features. First, there is no processing corresponding to steps S1, S2 in FIG. 3 because the encoding matrix G2 has already been obtained, and second, processing (steps S11 through S14) corresponding to steps S3 through S6 in FIG. 3 is carried out in a repeated manner by the number of the encoding rates which are desired to be varied.

In FIG. 7, first, a loop repetition variable i is set to the initial value (i=3) (step S10), and steps S11 through S14 inside a loop are carried out in a repeated manner.

Final loop processing (step S15) is to carry out the processing of steps S11 through S14 in a repeated manner, so that each time the step S14 is completed, a return is performed to the processing of step S10.

In step S10, each time the step S14 is completed, the value of the variable i is incremented by "1", wherein if the variable i satisfies a relation of "i≤c" with respect to the number c of the encoding rates to be desired to vary, the steps S11 through S14 inside the loop will be carried out again, whereas if a relation of "i>c" holds true, the processing routine of FIG. 7 will be ended.

Here, note that in the following description, it is assumed that a matrix H(i−1) represents a matrix Hs (s=i−1).

In step S11 following the initialization processing (step S10), the row division of the parity check matrix H(i−1) is carried out, so that a parity check matrix Hi with ri rows is generated, as shown in FIG. 5.

The row division of step S11 is carried out in such a manner that the individual row vectors which belong to the parity check matrix Hi become linearly independent from one another, similarly as in the above-mentioned first embodiment.

Subsequently, ri rows, which has been increased by the row division of step S11, is added to an encoding matrix G(i−1) (step S12).

In step S12, among the rows that have been generated in each row division, all the rows except for one row are added, respectively, as described in the above-mentioned first embodiment.

Then, lower triangulation is carried out under the same limitations as in the case of the above-mentioned first embodiment, so that an encoding matrix Gi is generated, as shown in FIG. 6 (step S13).

Finally, the column exchange of step S13 is carried out with respect to all the parity check matrices H1 through Hi (step S14), and then the routine shifts to loop processing (step S15).

The above steps S11 through S14 (corresponding to the above-mentioned steps S3 through S6) are carried out in a repeated manner until the processing of step S13 (corresponding to the above-mentioned step S5) is carried out to the parity check matrix of the LDPC code with the largest encoding rate (the largest number of rows).

Here, note that, as described in the above-mentioned first embodiment, if information on which row and how the row division has been carried out is stored at the decoding side, it will not be necessary to carry out the column exchange of all the parity check matrices H1 through Hi in step S14, but it will instead be sufficient to carry out the column exchange of only a part of the parity check matrices according to the information on the row division.

For example, the decoding method (or decoding device) may be constructed such that, at the decoding side, there is stored only the parity check matrix Hc, and there exist information on which row is to be added (i.e., exclusive OR being carried out for each element) to obtain the parity check matrix H(c−1) before the row division, and information on which row of the parity check matrix H(c−1) is to be added to obtain a parity check matrix H(c−2), and further information which can hereinafter recover or restore all the parity check matrices up to the original parity check matrix H1 in the same way as above. If the decoding method (or decoding device) is constructed in the above manner, in step S14 in FIG. 7, column exchange should just be carried out only with respect to the parity check matrix Hi.

This is because in each loop, if column exchange is applied to only the parity check matrix Hi, it will be possible to obtain the parity check matrix Hc.

Although in the above-mentioned description, the original parity check matrix H1 is constructed to be variable as one of the plurality of LDPC codes of which the encoding rates are different from one another, it is not necessary to necessarily include the parity check matrix H1 as one of the variable LDPC codes.

For example, the parity check matrix H2 obtained by applying the row division to the parity check matrix H1 is substituted for the parity check matrix H1 as a new parity check matrix which is newly denoted as a parity check matrix H1, according to the above processing, and then, if applying the above-mentioned generation method for the encoding matrix to the new parity check matrix H1, it is possible to generate an encoding matrix which does not correspond to the original parity check matrix, but corresponds to a plurality of parity check matrices which have been subjected to a plurality of row divisions.

As described above, according to the third embodiment of the present invention, operational effects equivalent to those of the above-mentioned first embodiment can be obtained, and besides, encoding corresponding to the c kinds of parity check matrices H1 through Hc can be carried out by means of the encoding matrix Gc, and a part of encoding operation can be made common among the different code rates, thus making it possible to reduce the arithmetic operations for encoding, the amount of arithmetic operations of an encoder, and the storage area as well as the circuit scale or size thereof.

In addition, in all the encoding rates which are variable, it is possible to set the code length constant.

Further, the column weight distributions are equal in all the encoding rates which are set to be variable, and hence, if the column weight distribution of the parity check matrix H1 is an optimum value, it is possible to achieve high error correction capability can be achieved in all the encoding rates which are set to be variable.

Moreover, even in cases where row combination is applied in place of the row division, as in the above-mentioned second embodiment, the construction can be made similar to that in the third embodiment of the present invention. In this case, if it is assumed that the original parity check matrix is set as Hc, and that the parity check matrices obtained by row combinations are placed sequentially in order from the largest number of rows to the smallest number of rows, as H(c−1), H(c−2), . . . , H1, and that thereafter the encoding matrices G2, G3, . . . , Gc are sequentially generated from the encoding matrix G1, similarly as in the case of the above-mentioned row divisions, it will be possible to obtain the encoding matrix Gc corresponding to the parity check matrices H1 through Hc.

Fourth Embodiment

Figure 8:
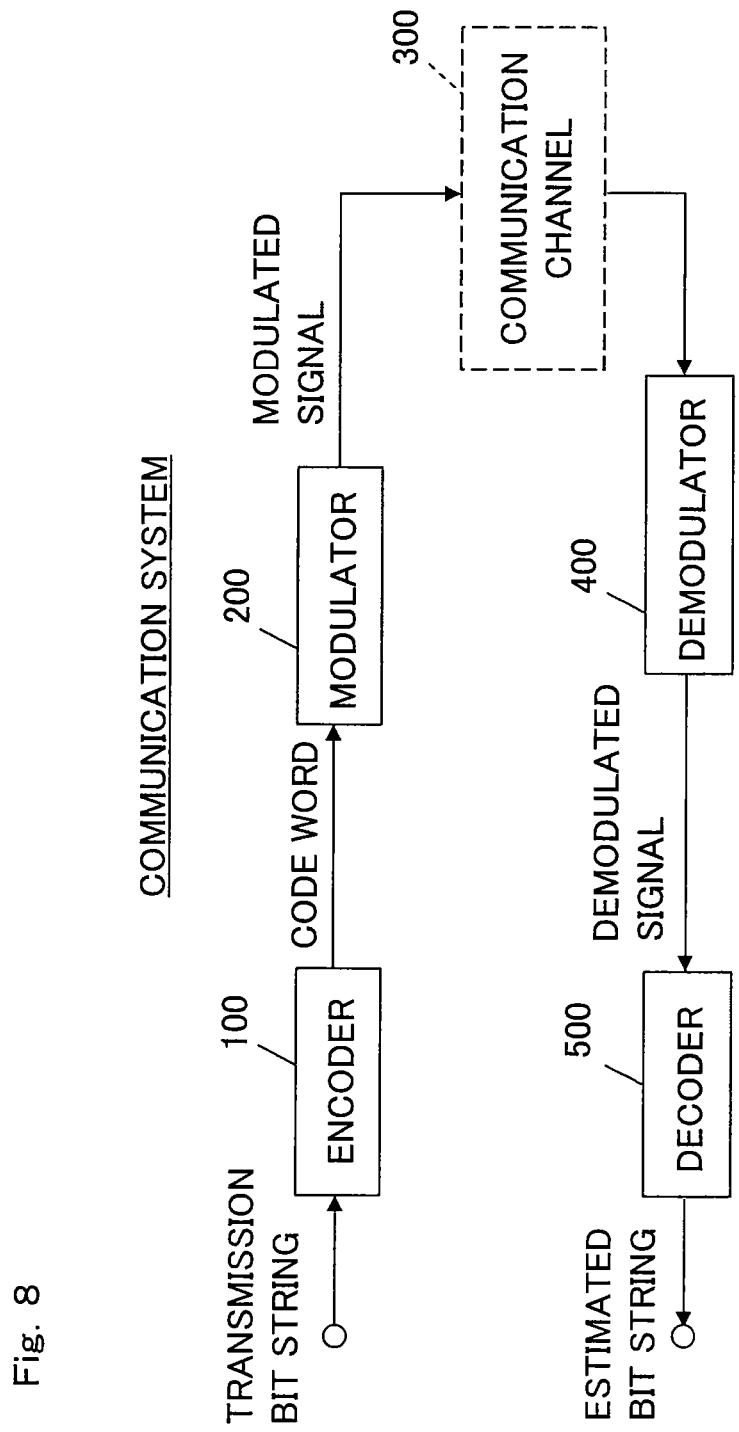
FIG. 8 is a block construction view showing a communication system according to a fourth embodiment of the present invention. (Fourth Embodiment)

Here, note that in the above-mentioned first through third embodiments (FIG. 1 through FIG. 7), there have been shown the generation methods (or devices) for the encoding matrix G in the error correction encoding methods (or devices), but a communication system can be constructed by the use of any of the error correction encoding methods (or devices), as shown in FIG. 8.

FIG. 8 is a block construction view showing a communication system according to a fourth embodiment of the present invention, wherein the communication system using the error correction encoding methods (or devices) according to the above-mentioned first through third embodiments is shown. In this case, in particular, an construction example is shown which is provided with an efficient encoder 100 using the encoding matrix G2 generated in the above-mentioned first embodiment (FIG. 3, FIG. 4).

In FIG. 8, the communication system is composed of a transmission side device and a reception side device, wherein the transmission side device is provided with the encoder 100 that serves to generate a code word of an error correcting code from a transmission bit string or sequence, and a modulator 200 that serves to generate a modulated signal based on the code word from the encoder 100.

The modulated signal from the modulator 200 is transmitted through a communication channel 300, so that it is received by the reception side device.

The reception side device is provided with a demodulator 400 that serves to demodulate the modulated signal received from the modulator 200 thereby to generate a demodulated signal, and a decoder 500 that serves to decode the error correcting code based on the demodulated signal from the demodulator 400.

The encoder 100 generates parity bits based on the transmission bit string, and calculates the code word.

The modulator 200 carries out modulation according to the code word, generates an electric wave, light, or an electrical signal in accordance with a communication method, and transmits it as a modulated signal.

The modulated signal transmitted from the modulator 200 passes through the communication channel 300 with noise being added thereto, so that it is then received by the reception side device.

The demodulator 400 demodulates the modulated signal thus received, so that it generates and inputs a demodulation signal to the decoder 500.

The decoder 500 generates and outputs a decoded result as an estimated bit string or stream which becomes transmission information.

Figure 9:
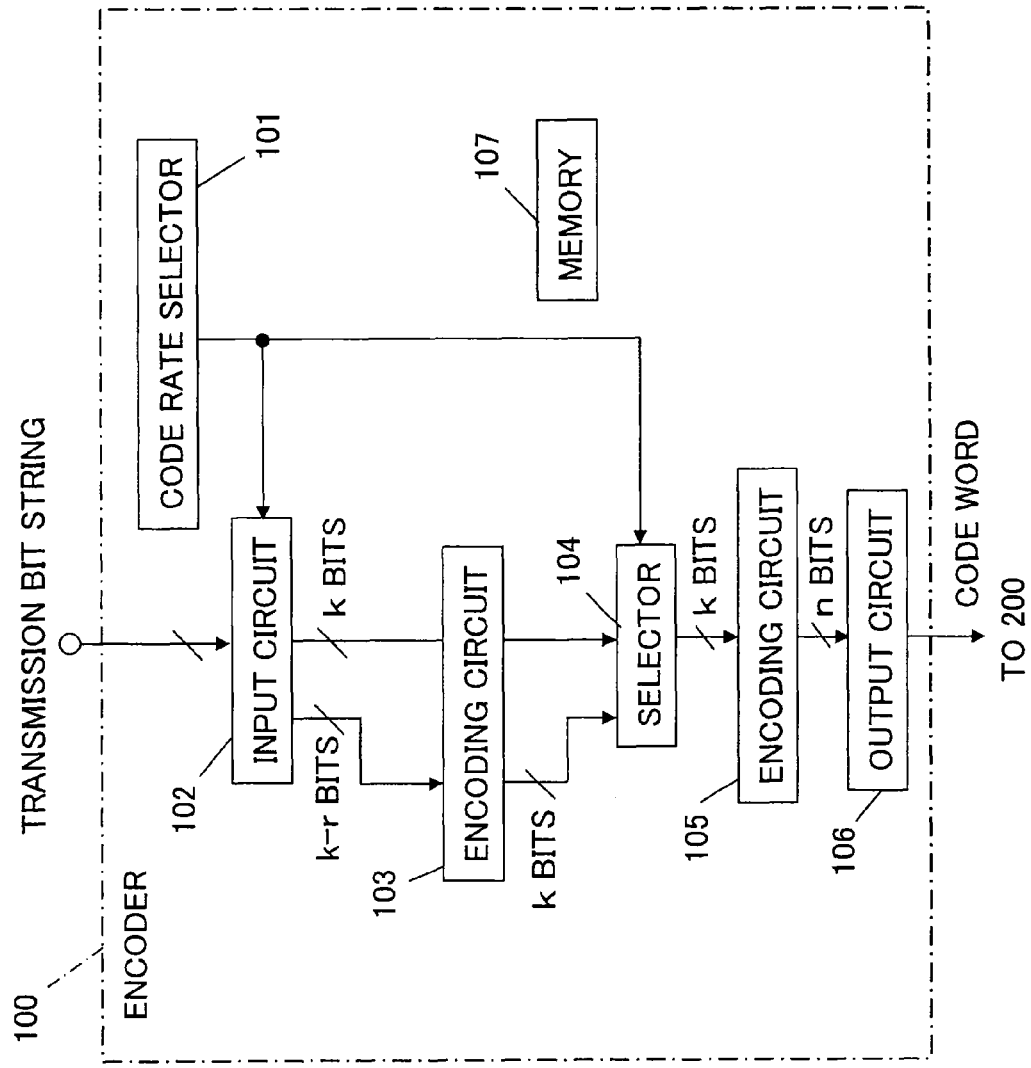
FIG. 9 is a block diagram showing an example of an internal configuration of an encoder according to the fourth embodiment of the present invention. (Fourth Embodiment)

FIG. 9 is a block diagram showing an internal configuration of the encoder 100 in FIG. 8, wherein an example of the encoder 100 which supports two kinds of encoding rates is shown.

In FIG. 9, the encoder 100 is provided with an encoding rate selector 101 that switches or changes over between the encoding rates of the LDPC code, an input circuit 102 that has a transmission bit stream or sequence inputted thereto, an encoding circuit 103 that encodes an input signal which is inputted thereto through the input circuit 102, a selector 104 that selects the input signal, an encoding circuit 105 that encodes the input signal which is inputted thereto through the selector 104, an output circuit 106 that controls an output signal of the encoding circuit 105 thereby to generate a code word, and a memory 107 that stores therein a variety of kinds of information.

Here, note that the code length of the LDPC code used with the encoder 100 shown in FIG. 9 is set as n bits.

In addition, the encoding rate selector 101 is constructed in such a manner that it can switch or change over between two kinds of encoding rates ("k/n", "(k−r)/n") corresponding to two kinds of information sequence lengths (k bits, "k−r" bits), respectively.

The encoding rate selector 101 switches and sets encoding rate information to be used with the communication system, and inputs it to the input circuit 102 and the selector 104.

Here, note that the encoding rate to be used with the communication system is set in advance, or is set in an automatic fashion in synchronization with the reception side device, or is manually switched by means of an external change-over switch (not shown), etc., or is decided by other arbitrary means.

The input circuit 102 carries out the control of the inputted transmission bit string or sequence, and temporarily stores the transmission bit sequence in the memory 107, and inputs the bit string based on the encoding rate information inputted from the encoding rate selector 101 to the encoding circuit 103 or the selector 104 in accordance with the encoding rate information ("k–r" or k)

That is, the input circuit 102 inputs a bit string of "k–r" bits to the encoding circuit 103, in the case of using the encoding rate "(k–r)/n" of the information sequence length of "k–r" bits, whereas it inputs a bit string of k bits to the selector 104 in the case of using the encoding rate "k/n" of the information sequence length of k bits.

The encoding circuit 103 first generates parity bits of r bits based on the inputted "k–r" bits.

At this time, the parity bits calculated based on the first through r-th rows of the encoding matrix G2 in FIG. 4 are generated in the encoding circuit 103. In other words, a parity bit string of r bits is generated by the use of r rows increased by row division and the inputted transmission bit string of "k–r" bits.

In addition, finally the encoding circuit 103 combines the transmission bit string of "k–r" bits and the generated parity bit string of r bits with each other, and inputs a bit string of k bits thus formed to the selector 104.

In the case of using the encoding rate "(k–r)/n" based on the encoding rate information set by the encoding rate selector 101, the selector 104 selects the bit string of k bits from the encoding circuit 103, whereas in the case of using the encoding rate "k/n", the selector 104 selects the bit string of k bits which has been inputted directly from the input circuit 102, and inputs it to the encoding circuit 105.

The encoding circuit 105 carries out encoding by the use of the bit string of k bits inputted from the selector 104. That is, the parity bits of "n–k" bits are generated by the use of the lower "n–k" rows of the encoding matrix G2 in FIG. 4.

The lower "n–k" rows of the encoding matrix G2 corresponds to both of the original parity check matrix H1 and the parity check matrix H2 after the row division, and hence are able to be shared by both of the encoding rates.

The encoding circuit 105 combines the generated "n–k" bits with the input bit string, and inputs a final bit string of n bits thus formed to the output circuit 106.

Finally, the output circuit 106 carries out the output control of the bit string after the encoding by the use of the memory 107 in accordance with the construction of the modulator 200, generates a code word used as an output signal of the encoder 100, and inputs it to the modulator 200.

Here, note that in the above description, the memory 107 has been used only in the input circuit 102 and the output circuit 106, but it may also be used in other parts according to the specifications of the communication system.

As described above, according to the fourth embodiment (FIG. 8, FIG. 9) of the present invention, in the communication system using the error correction encoding methods (or devices) according to the above-mentioned first through third embodiments of the present invention, it is constructed such that the code rate selector 101, the selector 104, and the encoding circuits 103, 105 are arranged inside of the encoder 100, so that the plurality of LDPC codes are able to be switched or changed over. With such a construction, the encoding circuit 105 can be shared by the LDPC codes of two kinds of code rates, thus making it possible to reduce the scale or size of the circuit structure.

Here, note that an example of the encoder 100 is shown in FIG. 9, however, if it is constructed such that the encoding circuit 105 inside the encoder 100 can be shared by the LDPC codes of two kinds of encoding rates, it will be possible to achieve the same effects as described above.

Similarly, the error correction encoding device applied to the communication system according to the fourth embodiment of the present invention is provided with row splitting means (step S3 in FIG. 3 and FIG. 4) to split each of a part or all of rows into two or more rows based on one parity check matrix, code construction means (step S5) to construct a plurality of LDPC codes with arbitrary code rates, respectively, and encoding means (encoder 100) to encode the plurality of LDPC codes, respectively, which have been generated by the code construction means, and of which the code lengths are equal to one another, and of which the code rates are different from one another.

The encoder 100 has only an encoding matrix corresponding to a maximum LDPC code which has the largest encoding rate among the plurality of LDPC codes, and encodes, at the time of encoding the LDPC codes other than the maximum LDPC code, them based on sub-matrices of the encoding matrix corresponding to the maximum LDPC code.

In addition, the encoder 100 is provided with maximum encoding means to carry out encoding based on the encoding matrix corresponding to the maximum LDPC code, encoding rate selection means (encoding rate selector 101) to select one from the plurality of LDPC codes, sub-matrix selection means (selector 104) to select from the encoding matrices a sub-matrix corresponding to the LDPC code selected by the encoding rate selection means, and a sub-matrix encoding means (encoding circuit 105) to carry out encoding by the use of only that portion in the largest encoding means which is based on the sub-matrix selected by the sub-matrix selection means.

According to this, as described above, it is possible for the LDPC codes of the two kinds of encoding rates ("k/n", "(k–r)/n") to share the encoding circuit 105 at the most output side inside of the encoder 100, as a result of which the scale or size of the circuit structure can be reduced.

Fifth Embodiment

Figure 10:
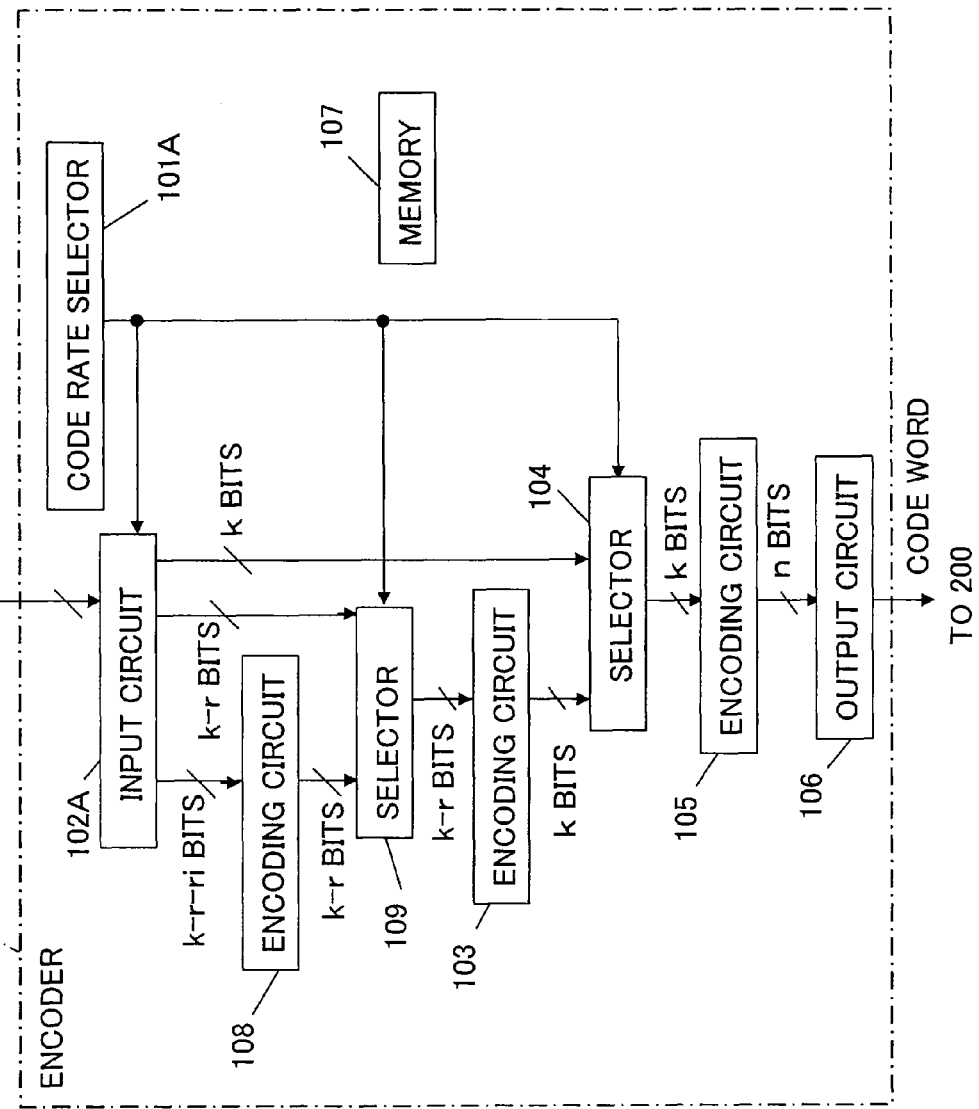
FIG. 10 is a block diagram showing an example of an internal configuration of an encoder according to a fifth embodiment of the present invention. (Fifth Embodiment)

Here, note that in the above-mentioned fourth embodiment (FIG. 8, FIG. 9), the encoder 100 has been used which performs variable setting of the two kinds of encoding rates, but as shown in FIG. 10, an encoder 100A may instead be used which carries out variable setting of three kinds of encoding rates.

FIG. 10 is a block diagram showing an internal configuration of the encoder 100A in a communication system using an error correction encoding method (or device) according to a fifth embodiment of the present invention, wherein those which are similar to the aforementioned ones (see FIG. 8 and FIG. 9) are denoted by the same reference numerals and characters as those in the aforementioned ones, while omitting a detailed explanation thereof.

In addition, the encoder 100A, an encoding rate selector 101A and an input circuit 102A in FIG. 10 correspond to the encoder 100, the encoding rate selector 101, and the input circuit 102 in the above-mentioned embodiment (FIG. 9).

In FIG. 10, the encoder 100A is provided with, in addition to the above-mentioned components 103 through 107, an encoding circuit 108 and a selector 109 which are connected to the input circuit 102A.

The selector 109 is inserted between the input circuit 102A and the encoding circuit 103, and the encoding circuit 108 is inserted between the input circuit 102A and the selector 109.

The encoding rate selector 101A is constructed in such a manner that it can switch or change over between three kinds of encoding rates ("k/n", "(k−r)/n", "(k−r−ri)/n") corresponding to three kinds of information sequence lengths (k bits, "k−r" bits, "k−r−ri" bits), respectively.

In cases where it is set in the encoding rate selector 101A such that a parity check matrix H3 (see FIG. 5) after having been subjected to two row divisions is used, the input circuit 102A inputs information bits of "k−r−ri" bits to the encoding circuit 108.

The encoding circuit 108 adds parity bits of ri bits to the inputted bit string, and inputs a bit string of ri bits to the selector 109. At this time, the parity bits added by the encoding circuit 108 is calculated based on upper ri rows of the encoding matrix G3 in FIG. 6.

The selector 109 selects an input bit string according to the encoding rate switched by the encoding rate selector 101A.

That is, in the case of using an LDPC code which has been subjected to two row divisions, the selector 109 selects a bit string (k−r bits) from the encoding circuit 108 and inputs it to the encoding circuit 103, whereas in the case of using an LDPC code which has been subjected to one row division, the selector 109 selects a bit string (k−r bits) from the input circuit 102A, and inputs it to the encoding circuit 103.

Hereafter, similar to the above-mentioned third embodiment (FIG. 9), an output signal (code word) of the encoder 100A is generated by means of the encoding circuit 103 to the output circuit 106, and is then inputted to the modulator 200.

As described above, according to the communication system of the fifth embodiment (FIG. 10) of the present invention, the encoding circuit 105 at the most output side inside of the encoder 100A can be shared by the LDPC codes of the three kinds of encoding rates ("k/n", "(k−r)/n", "(k−r−ri)/n"), and hence, it is possible for the LDPC codes of the two kinds of encoding rates ("k/n", "(k−r)/n") to share the encoding circuit 103 at the upstream side of the encoding circuit 105, as a result of which the scale or size of the circuit structure can be reduced.

Here, note that an example of the encoder 100A is shown in FIG. 10, however, if it is constructed such that the encoding circuits 105. 103 can be shared by LDPC codes of a plurality of encoding rates, it will be possible to achieve effects equivalent to those described above.

Moreover, in FIG. 10, in addition to the same construction as that in the above-mentioned fourth embodiment (FIG. 9), the encoding circuit 108 and the selector 109 are inserted between the encoding circuit 103 and the input circuit 102A, but besides this, by additionally inserting a new encoding circuit and a new selector (not shown) between the encoding circuit 108 and the input circuit 102A, it is also possible to construct an encoder which serves to carry out variable setting of four kinds of encoding rates. Hereafter, similarly, by performing additional insertion of one or more new encoding circuits and new selectors in a sequential manner, it is also possible to construct an encoder which is able to carry out variable setting of five or more kinds of encoding rates.

Sixth Embodiment

Here, note that in the above-mentioned first through third embodiments (FIG. 1 through FIG. 7), there have been shown the error correction encoding methods (or devices) to which an encoding matrix generation method to make an encoding matrix common between a basic parity check matrix and a parity check matrix generated by row splitting is applied, but in other cases, too, it is possible to construct a similar encoding matrix generation method.

Hereinafter, reference will be made to an error correction encoding method (or device) according to a sixth embodiment of the present invention.

In the sixth embodiment of the present invention, it is assumed that in cases where one of two parity check matrices H1, H2 with the same number of columns becomes a sub-matrix of the other parity check matrix, the same encoding matrix generation method as the above-mentioned one is applied.

Here, it is assumed that the parity check matrix H1 is a sub-matrix of the parity check matrix H2, and the row vectors of the parity check matrix H2 are linearly independent from one another. At this time, the row vectors of the parity check matrix H1 necessarily become linearly independent from one another.

The two parity check matrices H1, H2 of the above-mentioned relation are constructed by first preparing the parity check matrix H1, and then adding new rows to this parity check matrix H1 thereby to generate the parity check matrix H2, or by selecting a part of rows of the parity check matrix H2, and using a sub-matrix consisting of those rows as the parity check matrix H1, etc.

Although two LDPC codes having such a relation can share a part of decoding operation parts and hence are useful for communication systems which support variable encoding rates, encoding methods therefor pose a problem, as in the case of row division in the above-mentioned first embodiment.

In the sixth embodiment of the present invention, there is shown a generation method for the encoding matrix G2 which can be shared by two LDPC codes, as in the above-mentioned first embodiment.

Figure 11:
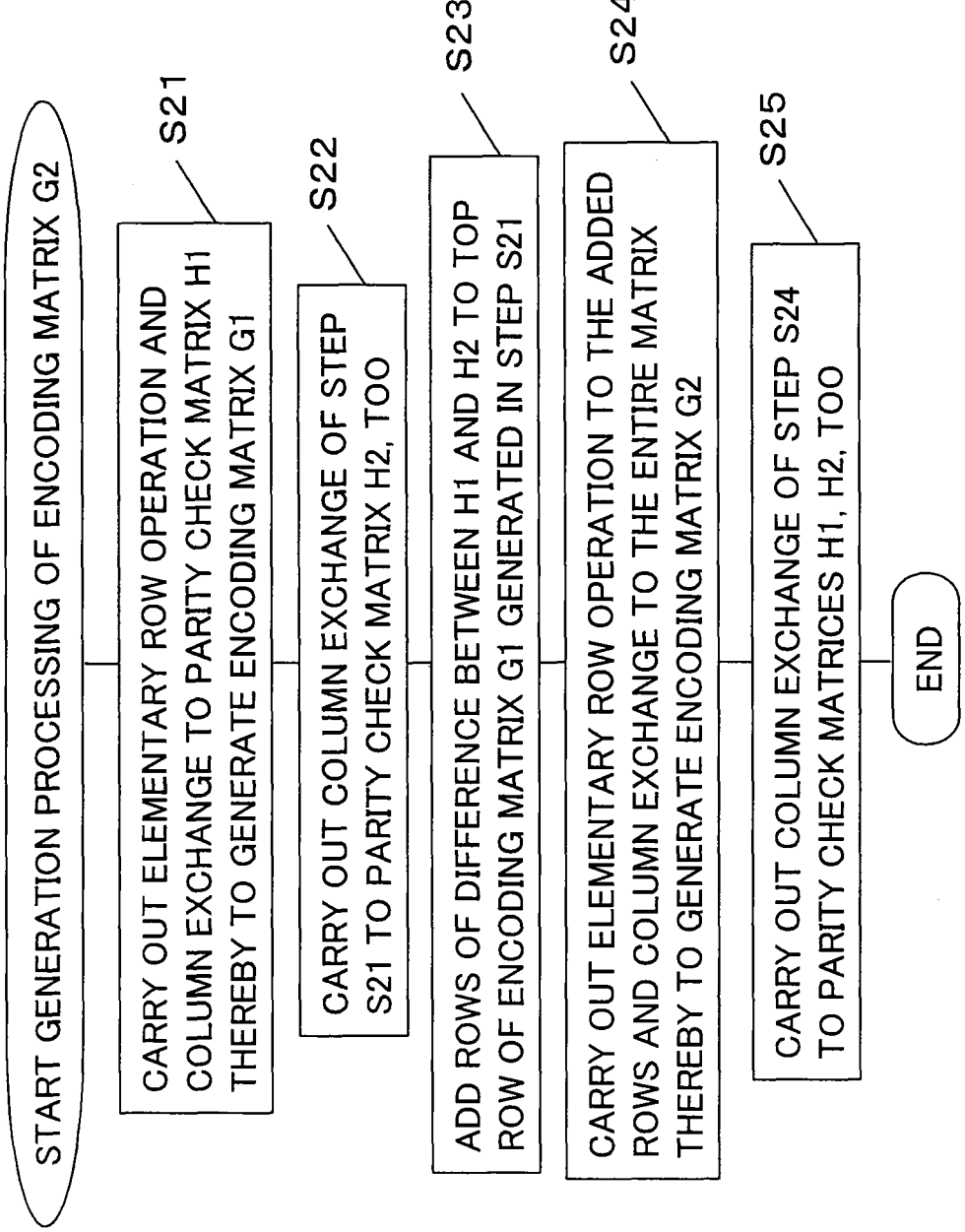
FIG. 11 is a flow chart showing a generation method for an encoding matrix according to a sixth embodiment of the present invention. (Sixth Embodiment)

FIG. 11 is a flow chart showing a routine (a procedure for processing) according to the sixth embodiment of the present invention, wherein a generation method for the encoding matrix G2, which can encode the parity check matrices H1, H2, is shown.

Here, note that steps S21 through S25 in FIG. 11 generally correspond to the above-mentioned steps S1, S2, and S4 through S6 (see FIG. 3).

First, the elementary row operation and column exchange are carried out to one parity check matrix H1 thereby to generate the encoding matrix G1 (step S21).

Subsequently, the column exchange of step S21 is also carried out with respect to the parity check matrix H2 (step S21).

Then, the rows of the parity check matrix H2 are added to the uppermost or top row of the encoding matrix G1 (step S23). At this time, the rows added to the top row of the encoding matrix G1 are a difference between the parity check matrix H1 and the parity check matrix H2. In other words, those rows among the rows of the parity check matrix H2 which are different from any of the rows of the parity check matrix H1 will be added.

Thereafter, the elementary row operation is carried out with respect to the rows added in step S23, and column exchange is carried out with respect to the entire rows, so that the encoding matrix G2 is generated by transforming the parity check matrix H2 into a lower triangular matrix (step S24).

The elementary row operation and the column exchange, which are carried out here, are performed under the same limitations as those in the above-mentioned step S5 (FIG. 3, FIG. 4). That is, the row exchange should not be carried out between the rows added in step S24 and the encoding matrix G1, and the column exchange should not be carried out with respect to those of the parity check matrix H2 in which the lower m rows have already become a lower triangular matrix (right-hand side m columns).

Finally, the same column exchange as in step S24 is carried out with respect to the parity check matrices H1, H2 (step S25), and then the processing routine of FIG. 11 is ended.

However, if it is constructed in a decoding method (or device) such that only the parity check matrix H2 is stored and information on which sub-matrix of the parity check matrix H2 becomes the parity check matrix H1 is also stored, the column exchange operation of step S25 should just be carried out only with respect to the parity check matrix H2.

In the above description, reference has been made to the case where a sub-matrix of the parity check matrix H2 becomes the parity check matrix H1 as it is, but if the arrangement or order of the columns and/or the rows of the two parity check matrices H1, H2 is changed arbitrarily, and if one of the matrices thus changed becomes a sub-matrix of the other, it is possible to generate an encoding matrix by means of the above-mentioned method.

That is, in advance, the arrangement of the columns and the rows is changed so as to put the two parity check matrices H1, H2 into the relation of sub-matrices (i.e., one is a sub-matrix of the other), and then, an encoding matrix should just be generated by means of the above-mentioned method. Here, note that even if the arrangement of the rows or the columns is changed, there will be almost no influence on the error correction capability.

In addition, in the above description, reference has been made to the two parity check matrices H1, H2, but with respect to three parity check matrices H1, H2, H3, too, it is possible to construct an encoding matrix G3 corresponding to the three parity check matrices H1 through H3 by means of a similar method.

In this case, it is assumed that the parity check matrix H1 is a sub-matrix of the parity check matrix H2, and that the parity check matrix H2 is a sub-matrix of the parity check matrix H3. First, the encoding matrix G2 corresponding to the parity check matrices H1, H2 are generated by means of a generation method for an encoding matrix in FIG. 11.

Subsequently, the rows of differences between the parity check matrix H3 and the parity check matrix H2 are added to the top row of the encoding matrix G2, which is then subjected to lower triangular processing (step S24) and column exchange (or switching) processing (step S25) in FIG. 11, so that the encoding matrix G3 corresponding to the three parity check matrices H1 through H3 can be generated. However, it is assumed that the row vectors of the parity check matrix H3 are linearly independent from one another.

Similarly, with respect to four or more parity check matrices, if there is the above-mentioned relation of sub-matrices, and if the row vectors of a parity check matrix with the largest number of rows are linearly independent from one another, it will be possible to generate an encoding matrix corresponding to the four or more parity check matrices.

As described above, according to the encoding matrix generation method which is applied in the error correction encoding method (or device) according to the sixth embodiment 6 (FIG. 11) of the present invention, the generated encoding matrix G2 can be used for the encoding of a plurality of LDPC codes which have one encoding matrix and different code rates.

In addition, if the error correction encoding method (or device) according to the sixth embodiment of the present invention is applied to a communication system with variable code rates, encoding operations or a storage area and an amount of arithmetic operations of an encoder can be made small, similarly as stated above.

Here, note that the same construction as those of the encoders 100, 100A in the above-mentioned fourth and fifth embodiments (FIG. 9, FIG. 10) can also be applied to the encoding matrix G2 generated in the sixth embodiment of the present invention. With such a construction, the encoding circuit 105 can be shared by a plurality of LDPC codes with different encoding rates, thus making it possible to reduce the scale or size of the circuit structure.

Further, according to the sixth embodiment of the present invention, in LDPC codes of variable encoding rates, the code lengths thereof can all be made the same.

EXPLANATION OF REFERENCE NUMERALS AND CHARACTERS 100, 100A encoders, 101, 101A encoding rate selectors, 102, 102A input circuits, 103, 105 encoding circuits, 104 selector, 106 output circuit, 108 encoding circuit, 109 selector, 200 modulator, 300 communication channel, 400 demodulator, 500 decoder, G, G1 through G3, Gc, Gi encoding matrices, H, H1 through H3, Hc, Hi parity check matrices, k information sequence length, r number of increased rows.

The invention claimed is:

1. An error correction encoding method in which a plurality of LDPC codes having code lengths equal to one another and code rates different from one another are encoded, comprising:
    an encoding step in which, when carrying out encoding of an LDPC code, among said plurality of LDPC codes, which corresponds to a code rate different from a first LDPC code corresponding to a first code rate, the encoding is carried out based on an encoding matrix for encoding an LDPC code which has a code length equal to that of said first LDPC code and a code rate different from that of said first LDPC code, said encoding matrix being generated based on a first encoding matrix or a sub-matrix of said first encoding matrix for carrying out the encoding of said first LDPC code, and the encoding step includes generation of a parity check matrix which has a plurality of LDPC code rates and a single row length and in which a number of rows corresponding to each of the LDPC code rates corresponds to a number of parity bits required for each respective LDPC code rate, and individual row vectors of the parity check matrix are linearly independent from one another.

2. The error correction encoding method as set forth in claim 1, wherein the encoding matrix for carrying out the encoding of said first LDPC code has a lower triangular structure.

3. The error correction encoding method as set forth in claim 2, wherein said encoding step includes an encoding matrix generation step to generate a second encoding matrix for carrying out the encoding of a second LDPC code which has a code length equal to that of said first LDPC code and a code rate smaller than that of said first LDPC code;
    wherein said encoding matrix generation step includes:
        a first lower triangulation step to transform a first parity check matrix of said first LDPC code into a lower triangular matrix thereby to generate said first encoding matrix;

a first column exchange step to apply a column exchange carried out in said first lower triangulation step to said first parity check matrix thereby to generate a second parity check matrix;

a row increasing step to increase the number of rows of the second parity check matrix to which said first column exchange step has been carried out, thereby to generate a third parity check matrix which corresponds to the code rate of said second LDPC code;

a row addition step to add the rows increased in said row increasing step to said first encoding matrix; and a second lower triangulation step to transform the whole of the first encoding matrix, to which rows have been added in said row addition step, into a lower triangular matrix without collapsing a lower triangular structure which those rows other than the added rows have, thereby to generate said second encoding matrix.

4. The error correction encoding method as set forth in claim 3, wherein said encoding matrix generation step includes:

a second column exchange step in which a column exchange carried out in said second lower triangulation step is applied to said second parity check matrix thereby to generate a fourth parity check matrix, and at a same time, the column exchange carried out in said second lower triangulation step is applied to said third parity check matrix thereby to generate a fifth parity check matrix.

5. The error correction encoding method as set forth in claim 4, wherein said encoding matrix generation step includes:

a repetition step to carry out said first lower triangulation step, said first column exchange step, said row increasing step, said row addition step, said second lower triangulation step, and said second column exchange step in a repeated manner by using said fourth parity check matrix as the first parity check matrix, sequentially from a parity check matrix of an LDPC code with the largest code rate among said plurality of LDPC codes to a parity check matrix of an LDPC code with the smallest code rate.

6. The error correction encoding method as set forth in claim 3, wherein said first parity check matrix is generated by extracting a sub-matrix of a parity check matrix of which the code rate is smaller than that of said first LDPC code.

7. The error correction encoding method as set forth in claim 3, wherein said row increasing step increases the rows by adding a new row to a sub-matrix of a parity check matrix of which the code rate is larger than that of said first LDPC code.

8. The error correction encoding method as set forth in claim 3, wherein said first parity check matrix is generated by combining a plurality of rows of the parity check matrix.

9. The error correction encoding method as set forth in claim 3, wherein said row increasing step increases the number of rows by applying a row splitting to split a row of said second parity check matrix into two or more rows.

10. An error correction encoding device in which a plurality of LDPC codes having code lengths equal to one another and code rates different from one another are encoded, comprising:

encoding circuitry configured to carry out, when encoding an LDPC code, among said plurality of LDPC codes, which corresponds to a code rate different from a first LDPC code corresponding to a first code rate, the encoding based on an encoding matrix for encoding an LDPC code which has a code length equal to that of said first LDPC code and a code rate different from that of said first LDPC code, said encoding matrix being generated based on a first encoding matrix or a sub-matrix of said first encoding matrix for carrying out the encoding of said first LDPC code, and the encoding circuitry is configured to generate a parity check matrix which has a plurality of LDPC code rates and a single row length and in which a number of rows corresponding to each of the LDPC code rates corresponds to a number of parity bits required for each respective LDPC code rate, and individual row vectors of the parity check matrix are linearly independent from one another.

11. The error correction encoding device as set forth in claim 10, wherein said encoding circuitry is configured to:

perform encoding based on an encoding matrix corresponding to said first LDPC code;

select one from said plurality of LDPC codes;

select from said encoding matrix a sub-matrix corresponding to the selected one from said plurality of LDPC code; and carry out encoding by use of only that portion which is based on the selected sub-matrix selected.

12. A communication system using the error correction encoding device as set forth in claim 10, wherein said communication system is constructed such that said plurality of LDPC codes can be changed over.

* * * * *